(12) United States Patent
Cheng et al.

(10) Patent No.: US 8,674,503 B2
(45) Date of Patent: Mar. 18, 2014

(54) CIRCUIT BOARD, FABRICATING METHOD THEREOF AND PACKAGE STRUCTURE

(75) Inventors: Pai-Sheng Cheng, Tainan (TW); Chia-Hui Wu, Tainan (TW)

(73) Assignee: Himax Technologies Limited, Xinshi Dist., Tainan (TW)

( * ) Notice: Subject to any disclaimer, the term of this patent is extended or adjusted under 35 U.S.C. 154(b) by 6 days.

(21) Appl. No.: 13/253,088

(22) Filed: Oct. 5, 2011

(65) Prior Publication Data
US 2013/0087906 A1    Apr. 11, 2013

(51) Int. Cl.
H01L 23/48    (2006.01)
H01L 23/52    (2006.01)
H01L 23/28    (2006.01)
H01L 29/40    (2006.01)

(52) U.S. Cl.
USPC ........... 257/737; 257/734; 257/738; 257/778; 257/779

(58) Field of Classification Search
USPC .......................... 257/737, 734, 738, 778, 779
See application file for complete search history.

(56) References Cited

U.S. PATENT DOCUMENTS 5,990,564 A * 11/1999 Degani et al. ................. 257/778
6,025,649 A * 2/2000 DiGiacomo ................... 257/779
6,538,334 B2 * 3/2003 Akram et al. ................. 257/778
2003/0067073 A1 * 4/2003 Akram et al. ................. 257/738
2004/0164409 A1 * 8/2004 Schammler et al. .......... 257/734

FOREIGN PATENT DOCUMENTS

TW    201034137    9/2010

OTHER PUBLICATIONS

W. J. Choice, "Mean-Time-to-failure study of Flip Chip solder joints on Cu/Ni (V)/Al thin-film under-bump-metallization", Journal of Applied Physics, vol. 94, No. 9, pp. 5665-5671 (Nov. 2003).*
Md Syful Islam, "Peripheral soldering of Flip Chip joints on passive RFID tags", a Ph.D Dissertation, Department of Mechanical Engineering, University of Nevada Las Vegas (May 2011).*
M. J. Yim, "Recent advances on anisotropic conductive adhesives (ACAs) for flat panel displays and semiconductor packaging applications", International Journal of Ahesion & Ahesives, 26, pp. 304-313 (2006).*

* cited by examiner

Primary Examiner — Long K Tran
Assistant Examiner — Dzung Tran
(74) Attorney, Agent, or Firm — Winston Hsu; Scott Margo

(57) ABSTRACT

The present invention provides a circuit board including a substrate, at least one lead, at least one bump, and a solder layer. The lead is disposed on the substrate, and the bump is disposed on the lead. The solder layer covers the lead and the bump.

18 Claims, 6 Drawing Sheets

CIRCUIT BOARD, FABRICATING METHOD THEREOF AND PACKAGE STRUCTURE

BACKGROUND OF THE INVENTION

1. Field of the Invention

The present invention relates to a circuit board, a fabricating method thereof and a package structure, and more particularly, to a circuit board which lead has a bump disposed thereon, and a fabricating method thereof and a package structure.

2. Description of the Prior Art

Flip-chip packaging processes are one of the most popular electronic packaging processes utilized today. In contrast to the some other packaging processes, the chips utilized in the flip-chip packaging processes are not electrically connected to a packaging substrate via a bonding pad through a wire bonding process. Instead, a plurality of gold bumps are respectively formed on each bonding pads. Then, the chips are inverted and an anisotropic conductive film or silver paste is utilized to adhere the gold bumps to a package substrate. Ideally, flip-chip packaging processes are able to significantly reduce the size of package structures and increase the circuit transmission between the chips and the packaging substrate because no extra wires are required for establishing a connection.

Please refer to FIG. 1. FIG. 1 is a schematic diagram illustrating a chip with a gold bump according to the prior art. As shown in FIG. 1, a chip 10 includes a chip substrate 12, a bonding pad 14, a protective layer 16, and a gold bump 18. The bonding pad 14 is disposed on the chip substrate 12, and the protective layer 16 covers the chip substrate 12 and a part of the bonding pad 14. The gold bump 18 is disposed on the bonding pad 14 and in contact with the bonding pad 14. Furthermore, in order to avoid the chip substrate 12 from being in contact with the package substrate when the chip 10 is bonding onto the package substrate, the gold bump 18 has a height between 12 micrometers and 15 micrometers.

However, the gold bump is formed by gold, and the price of gold gradually rises and is expensive. Thus, the fabricating cost of bonding the chip onto the package substrate is gradually increased. Hence, it has become an important task in this field to reduce the fabricating cost of bonding the chip onto the package substrate.

SUMMARY OF THE INVENTION

It is therefore an objective of the present invention to provide a circuit board, a fabricating method thereof and a package structure to reduce the fabricating cost of bonding the chip onto the circuit board.

According to a preferred embodiment of the present invention, a circuit board is disclosed. The circuit board includes a substrate, at least one lead, at least one bump, and a solder layer. The lead is disposed on the substrate, and the bump is disposed on the lead. The solder layer covers the lead and the bump.

According to another preferred embodiment of the present invention, a package structure is disclosed. The package structure includes a substrate, at least one lead, at least one first bump, a solder layer, and a chip. The lead is disposed on the substrate, and the first bump is disposed on the lead. The solder layer covers the lead and the first bump, and the chip is disposed on the first bump.

According to another preferred embodiment of the present invention, a fabricating method of a circuit board is disclosed. First, a substrate is provided. Then, a lead is formed on the substrate. Next, a bump is formed on the lead. Thereafter, a solder layer is formed to cover the lead and the bump.

The present invention disposes the first bump on the lead to reduce the height of the second bump to be smaller than 5 micrometers. For this reason, the material cost of the second bump of the chip can be effectively saved as compared with the height of the gold bump of the chip being between 12 micrometers and 15 micrometers. Therefore, the fabricating cost of bonding the chip 302 onto the circuit board 100 can be effectively reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
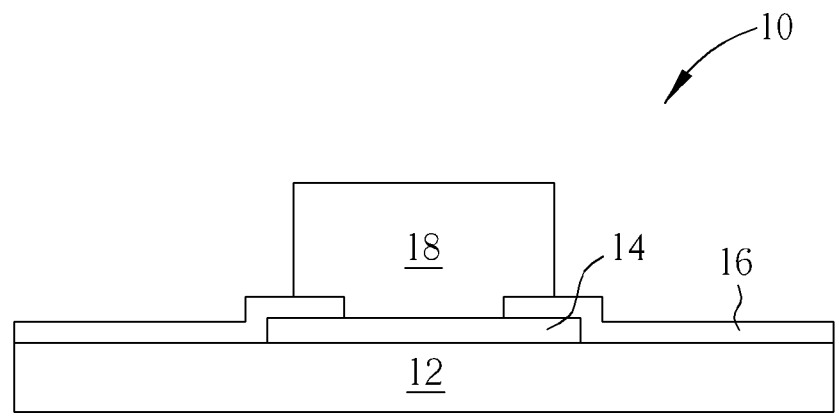
FIG. 1 is a schematic diagram illustrating a chip with a gold bump according to the prior art.
Figure 2:
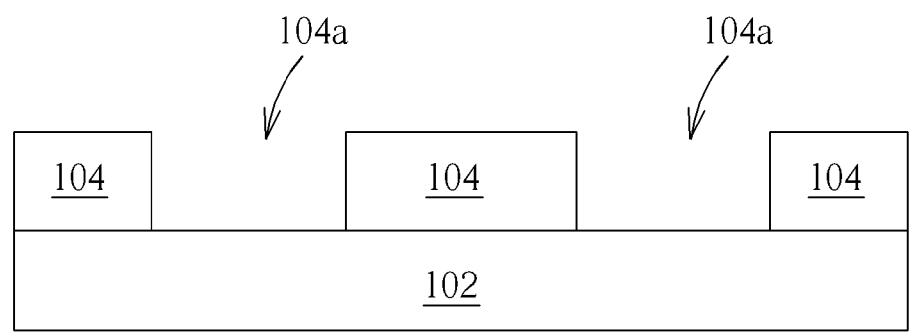
FIG. 2 through FIG. 6 are schematic diagrams illustrating a fabricating method of a circuit board according to a first preferred embodiment of the present invention.
Figure 4:
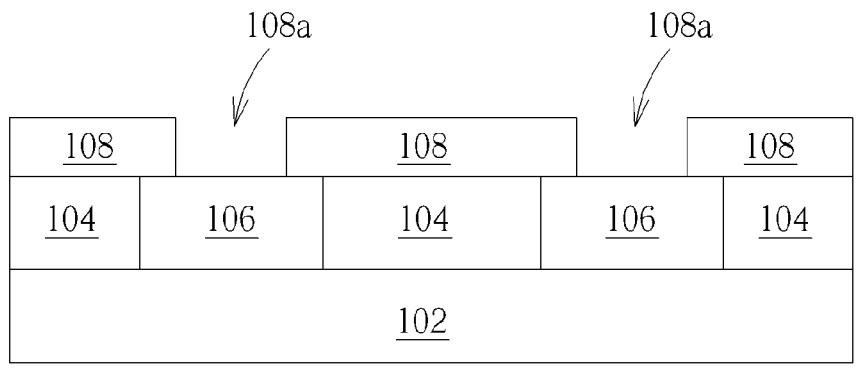
Figure 5:
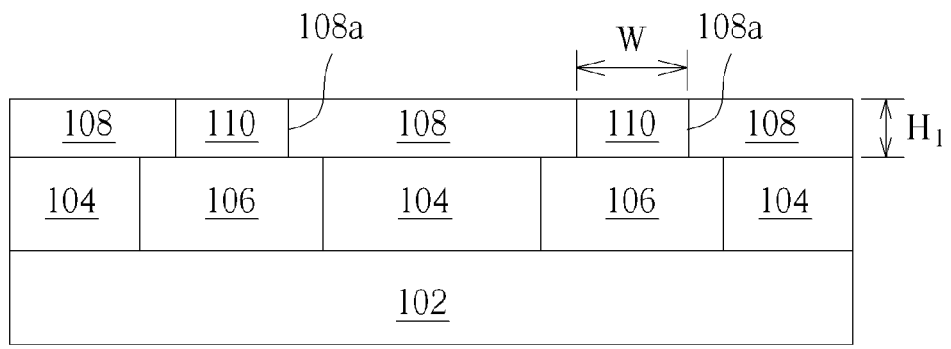
Figure 6:
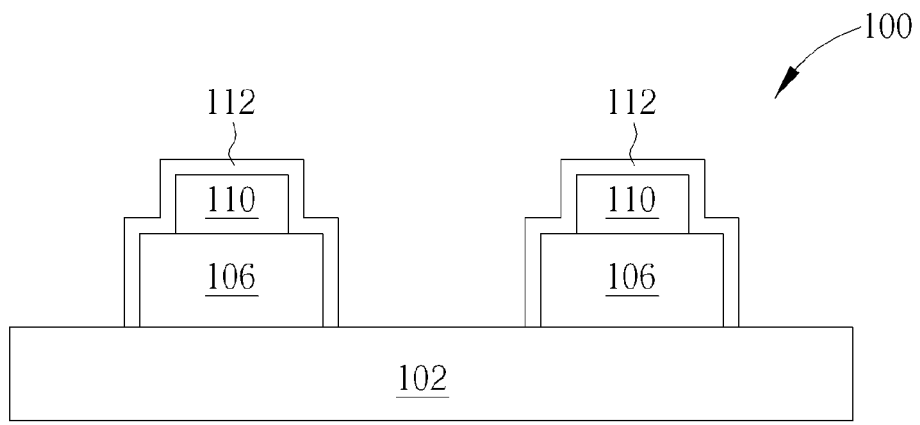

Please refer to FIG. 2 through FIG. 6. FIG. 2 through FIG. 6 are schematic diagrams illustrating a fabricating method of a circuit board according to a first preferred embodiment of the present invention, wherein FIG. 6 is a schematic diagram illustrating a cross-sectional view of the circuit board according to the first preferred embodiment of the present invention. As shown in FIG. 2, a substrate 102 is provided first, and then a first patterned photoresist layer 104 is formed on the substrate 102. The first patterned photoresist layer 104 has a plurality of first openings 104a exposing a plurality of parts of the substrate 102. In this embodiment, the substrate 102 can be a printed circuit board, a flexible circuit board or a glass substrate, and a material of the substrate 102 can include polyimide, epoxy resin or glass, but the present invention is not limited herein.

Figure 3:
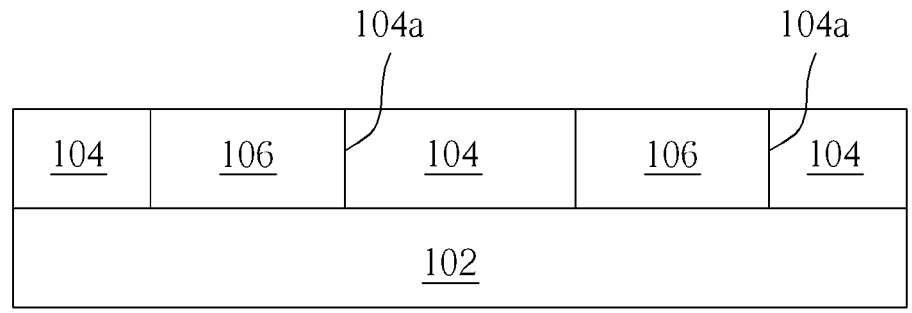

As shown in FIG. 3, a plurality of leads 106 is then formed on the exposed substrate 102, and each lead 106 is disposed in each first opening 104a. In this embodiment, the step of forming the leads 106 can utilize an electroplating process, but is not limited to this. Furthermore, each lead 106 can be made of a material that can be formed by the electroplating process, and the material can include copper, nickel or chrome, but the present invention is not limited to this.

As shown in FIG. 4, a second patterned photoresist layer 108 is next formed on the first patterned photoresist layer 104 and a part of each lead 106. The second patterned photoresist layer 108 has a plurality of second openings 108a and each of which respectively exposes each lead 106. In this embodiment, a width of each second opening 108a is equal to or smaller than a width of each lead 106.

As shown in FIG. 5, a plurality of first bumps 110 are subsequently formed on each exposed lead 106, respectively, and each first bump 110 is disposed in each second opening 108a respectively. In this embodiment, the step of forming the first bumps 110 can utilize another electroplating process, but is not limited to this. Furthermore, each first bump 110 has a height $H_1$ and a width W. The height $H_1$ of each first bump 110 is larger than 1 micrometer, and the width W of each first bump 110 is equal to or smaller than the width of each lead 106. Each first bump 110 includes aluminum or copper, but the present invention is not limited to this.

As shown in FIG. 6, next, the first patterned photoresist layer 104 and the second patterned photoresist layer 108 are removed. Then, a plurality of solder layers 112 are respectively formed on the leads 106 and the first bumps 110, and the circuit board 100 of this embodiment is completed. In this embodiment, each solder layer 112 covers each lead 106 and each corresponding first bump 110, and the solder layers 112 are electrically insulated from each other. The present invention is not limited to this, and each solder layer 112 can be only disposed on each first bump 110. In addition, each solder layer 112 can be made of a material that can be utilized to be bonded to gold, and the material can include nickel (Ni), palladium (Pd), gold (Au) or stannum (Sn). The material of each solder layer in the present invention is not limited to this, and can be other conductive material by performing other bonding processes.

It should be noted that the circuit board 100 of this embodiment includes each first bump 110 formed on each lead 106, so that a height of a second bump on a chip used to be bonded to the first bump 110 can be reduced when a gap between the chip and the circuit board 100 is fixed. For this reason, the material cost of the second bump of the chip can be saved so as to reduce the fabricating cost of bonding the chip onto the circuit board 100.

In the present invention, the number of the first opening 104a is not limited to be a plurality, and may be only one, so that the number of the leads 106 also maybe only one. Furthermore, the number of the second opening 108a is also not limited to be a plurality, and may be only one so that the number of the first bump 110 and the number of the solder layer 112 may be only one.

The fabricating method of the circuit board in the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 7:
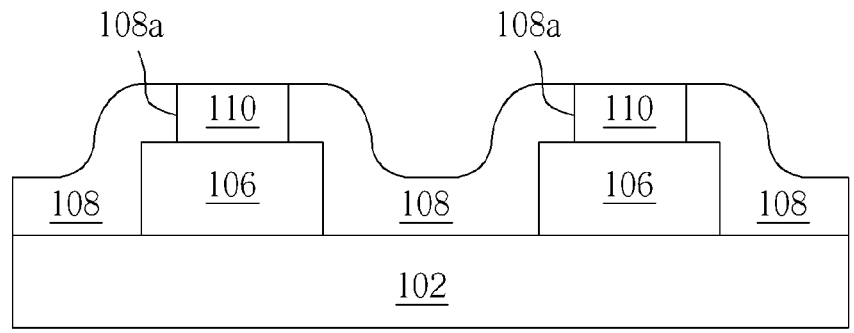
FIG. 7 is schematic diagrams illustrating a fabricating method of a circuit board according to a second preferred embodiment of the present invention.

Please refer to FIG. 7 together with FIGS. 2, 3 and 6. FIG. 7 is schematic diagrams illustrating a fabricating method of a circuit board according to a second preferred embodiment of the present invention. As compared with the first embodiment, the steps of the fabricating method in this embodiment before forming the second patterned photoresist layer 108 are the same as the steps of the fabricating method in the first embodiment, as shown in FIG. 2 and FIG. 3, and are not detailed redundantly. As shown in FIG. 7, thereafter, the first patterned photoresist layer 104 is removed before forming the second patterned photoresist layer 108. Then, the second patterned photoresist layer 108 is formed on the substrate 102, and the second patterned photoresist layer 108 has the second openings 108a respectively exposing the leads 106. After that, the first bumps 110 are formed respectively on the exposed leads 106. Next, the steps of fabricating method in this embodiment are the same as the steps of the fabricating method in the first embodiment, as shown in FIG. 6.

Figure 8:
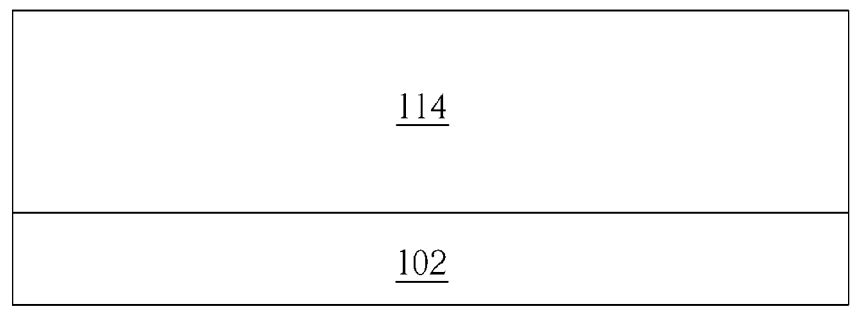
FIG. 8 through FIG. 10 are schematic diagrams illustrating a fabricating method of a circuit board according to a third preferred embodiment of the present invention.
Figure 9:
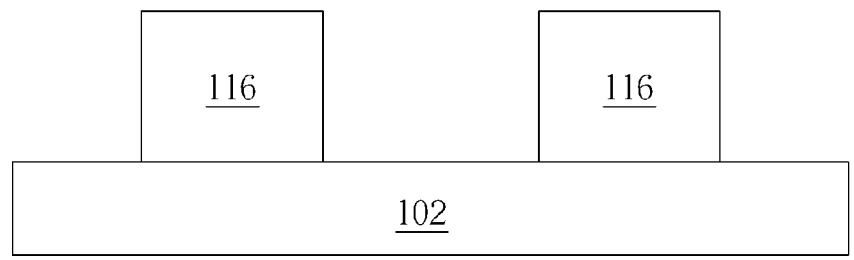
Figure 10:
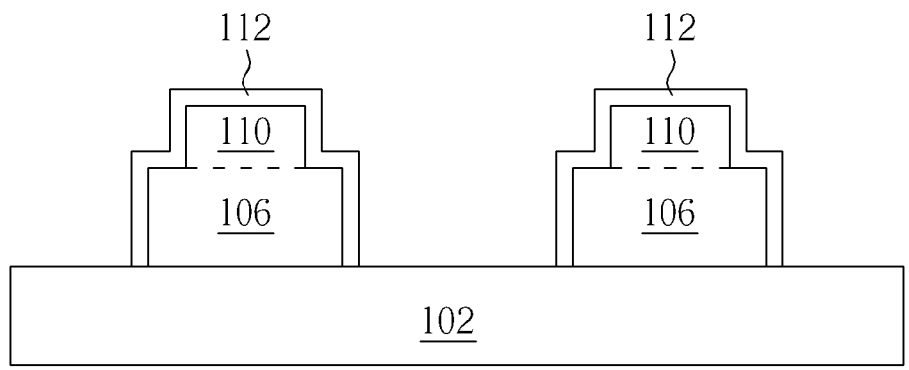

Please refer to FIG. 8 through FIG. 10. FIG. 8 through FIG. 10 are schematic diagrams illustrating a fabricating method of a circuit board according to a third preferred embodiment of the present invention. As shown in FIG. 8, the substrate 102 is provided, and then a metal layer 114 is formed on the substrate 102. In this embodiment, the step of forming the metal layer 114 may be another electroplating process or a physical evaporation process, but is not limited herein. Furthermore, a material of the substrate 102 includes polyimide, epoxy resin or glass, but the present invention is not limited herein. The metal layer 114 is made of a conductive material including aluminum, copper, nickel or chrome. As shown in FIG. 9, a photolithographic and etching process is performed to pattern the metal layer 114 thereafter, and a plurality of lead patterns 116 are formed on the substrate 102. As shown in FIG. 10, another photolithographic and etching process is then performed to pattern each lead pattern 116, and a plurality of first bumps 110 and a plurality of leads 106 are simultaneously formed. Each first bump 110 is disposed on each lead 106. After that, a plurality of solder layers 112 are formed to respectively cover each lead 106 and each corresponding first bump 110.

Figure 11:
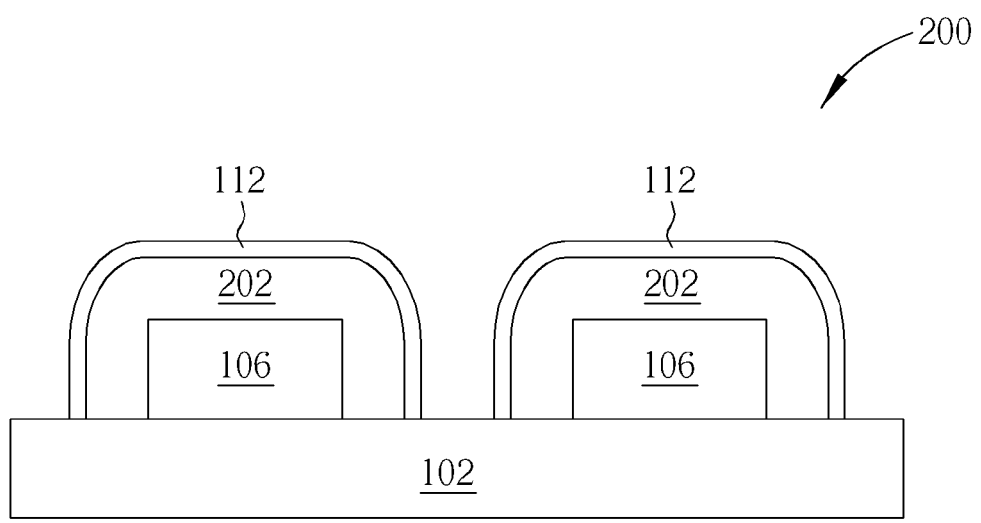
FIG. 11 is a schematic diagram illustrating a cross-sectional view of the circuit board according to a fourth embodiment of the present invention.

The structure of the circuit board in the present invention is not limited to the above-mentioned embodiment. Please refer to FIG. 11, which is a schematic diagram illustrating a cross-sectional view of the circuit board according to a fourth embodiment of the present invention. As shown in FIG. 11, as compared with the first embodiment, each first bump 202 of the circuit board 200 in this embodiment covers each lead 106, so that the width of each first bump 202 is larger than the width of each lead 106. Each solder layer 112 covers each first bump 202.

Figure 12:
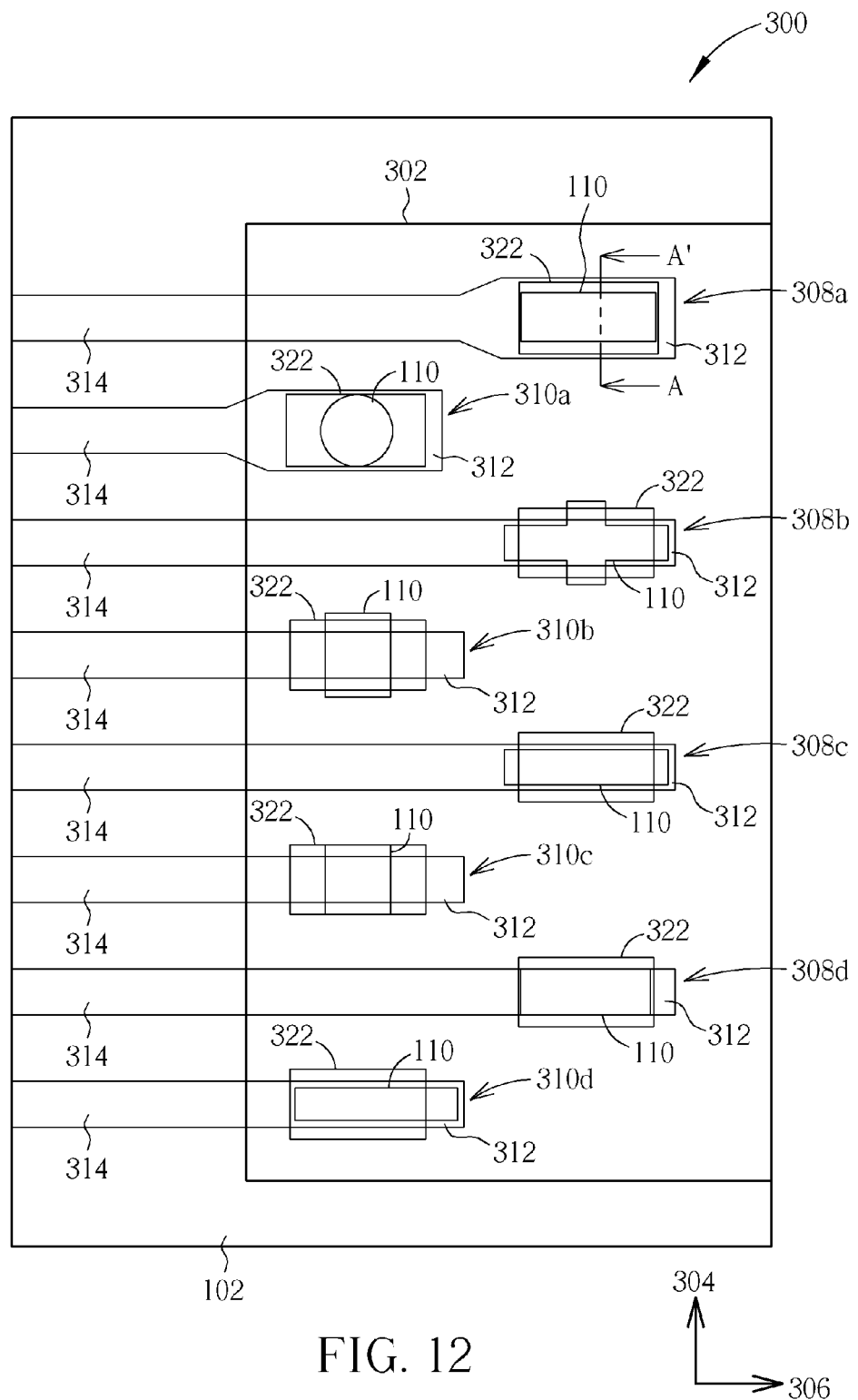
FIG. 12 is a schematic diagram illustrating a top view of a package structure according to a fifth preferred embodiment of the present invention.
Figure 13:
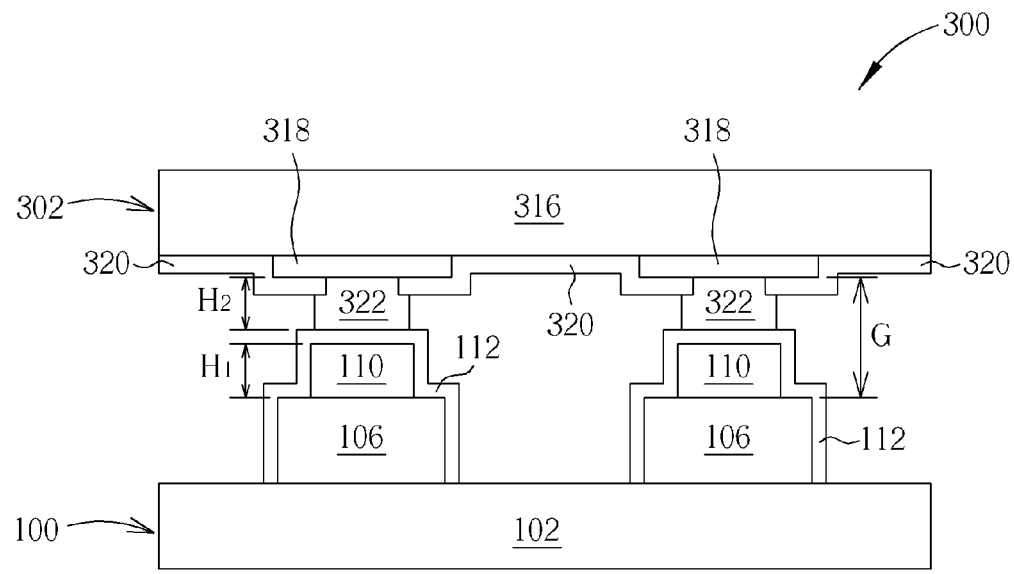
FIG. 13 is a schematic diagram illustrating a cross-sectional view of the package structure shown in FIG. 12 along a cutting line A-A'.

The present invention further provides a package structure assembling a chip with a bump with a circuit board. Please refer to FIG. 12 and FIG. 13. FIG. 12 is a schematic diagram illustrating a top view of a package structure according to a fifth preferred embodiment of the present invention, and FIG. 13 is a schematic diagram illustrating a cross-sectional view of the package structure shown in FIG. 12 along a cutting line A-A'. As shown in FIG. 12 and FIG. 13, the package structure 300 includes a circuit board 100 and a chip 302, and the chip 302 is disposed on the circuit board 100. The circuit board 100 in this embodiment is the same as the circuit board in the first embodiment, as shown in FIG. 6, and the same parts are not detailed redundantly. In this embodiment, the leads 106 are arranged along a first direction 304, and each lead 106 is extended along a second direction 306. The leads 106 can be divided into a plurality of long leads 308a, 308b, 308c, 308d and a plurality of short leads 310a, 310b, 310c, 310d, and each long lead 308a, 308b, 308c, 308d and each short lead 310a, 310b, 310c, 310d are alternately arranged. Thus, tip ends 312 of the long leads 308a, 308b, 308c, 308d are formed in an in-line type, and tip ends 312 of the short leads 310a, 310b, 310c, 310d are also formed in the in-line type. Furthermore, at least one of the tip ends 312 of the long leads 308a, 308b, 308c, 308d has a width along the first direction 304 larger than a width of a body portion 314 connected thereto, and at least one of the tip ends 312 of the short leads 310a, 310b, 310c, 310d has a width larger than a width of a body portion 314 connected thereto. In other embodiments of the present invention, the tip ends 312 of the leads 106 may be arranged in an in-line type.

In addition, the long leads 308a, 308b, 308c, 308d include a first long lead 308a, a second long lead 308b, a third long lead 308c, and a fourth long lead, and the short leads 310a, 310b, 310c, 310d include a first short lead 310a, a second short lead 310b, a third short lead 310c, and a fourth short lead 310d. The first bumps 110 on the tip ends 312 of the first long lead 308a, the third long lead 308c, the fourth long lead 308d, the second short lead 310b, the third short lead 310c, and the fourth short lead 310d have a rectangular shape. The first bump 110 on the tip end 312 of the second long lead 308b has a crisscross shape, and the first bump 110 on the tip end 312 of the first short lead 310a has a circular shape. The widths along the first direction 304 of the first bumps 110 on the first long lead 308a, the third long lead 308c, the first short lead 310a, the fourth short lead 310d are smaller than the widths of the tip ends 312 of the corresponding leads 106. The width of the first bump 110 on the fourth long lead 308d is equal to the width of the tip end 312 of the fourth long lead 308d, and the widths of the first bumps 110 on the second short lead 310b and the third short lead 310c are larger than the widths of the tip ends 312 of the second short lead 310b and the third short lead 310c. Moreover, each first bump 110 has the first height $H_1$, larger than 1 micrometer. In other embodiments of the present invention, the first bumps 110 may have the same shape or different shapes, such as rectangular, circular, or crisscross, and the widths along the first direction 304 of the first bumps 110 maybe larger than, equal to or smaller than the widths along the first direction 304 of the tip ends 312 of the leads 106.

The chip 302 includes a chip substrate 316, a plurality of bonding pads 318, a protective layer 320, and a plurality of second bumps 322. The chip substrate 316 disposed opposite to the circuit board 100, and the bonding pads 318 are disposed on a side of the chip substrate 316 opposite to the circuit board 100. The protective layer 320 covers the chip substrate 316 and a part of each bonding pad 318, and each second bump 322 is disposed on each bonding pad 318 without being covered with the protective layer 320. Each second bump 322 can be bonded to each solder layer 112, so that each bonding pad 318 can be electrically connected to each lead 106 respectively via each bonding pad 318, each second bump 322 and each first bump 110 through performing a bonding process. In this embodiment, each second bump 322 includes gold, and the bonding process can be a eutectic process. In this embodiment, each second bump 322 composed of gold and each corresponding solder layer 112 bonded with each other can be melt with each other to form an Au—Sn alloy. The present invention is not limited herein, and the material of the second bump 322 can be made of a conductive material that can be utilized to be bonded to the solder layer.

Furthermore, the width of each second bump 322 along the first direction 304 can be smaller than the widths of the tip ends 312 of the first long lead 308a and the first short lead 310a and larger than the widths of the tip ends 312 of the second long lead 308b, the third long lead 308c, the fourth long lead 308d, the second short lead 310b, the third short lead 310c and the fourth short lead 310d. The width of each second bump 322 is also larger than the widths of the first bumps 110 on the first long lead 308a, the third long lead 308c, the fourth long lead 308d and the fourth short lead 310d, and smaller than the widths of the first bumps 110 on the second long lead 308b and the second short lead 310b. The width of each second bump 322 is equal to the widths of the first bumps 110 on the first short lead 310a and the third short lead 310c. The present invention is not limited to the above-mentioned, and the width of each second bump 322 along the first direction 304 can be larger than, equal to or smaller than the widths of the first bump 110 and the width of each tip end 312 of each lead 106. Similarly, the length of the second bump 322 along the second direction 306 can be larger than, equal to or smaller than lengths of the first bump 110 along the second direction 306. Moreover, since each lead 106 has each first bump 110 disposed thereon, each second bump 322 of this embodiment can have a second height $H_2$ smaller than 5 micrometers when the gap between the chip 302 and the circuit board 100 can be fixed in a specific distance. Since gold easily migrates, the second height $H_2$ of each second bump 322 being smaller than 5 micrometers in this embodiment can prevent the migration of gold between two adjacent second bumps 322. Also, each second bump 322 and each corresponding solder layer 112 are bonded to form the Au—Sn alloy, and the migration of gold between two adjacent second bumps 322 can be avoided. Furthermore, each bonding pad 318 and each corresponding lead 106 have a gap G larger than 1 micrometer in this embodiment, so that the circuit in the chip substrate 316 and other bonding pads 318 that do not corresponding to the lead 106 would not be electrically connected to the lead 106.

As compared with the height of the gold bump of the chip being between 12 micrometers and 15 micrometers in the prior art, the package structure 300 in this embodiment disposes each first bump 110 on each lead 106 to reduce the second height $H_2$ of each second bump 322 to be smaller than 5 micrometers. Therefore, the material cost of the second bumps 322 of the chip 302 can be effectively saved so as to reduce the fabricating cost of bonding the chip 302 onto the circuit board 100.

Figure 14:
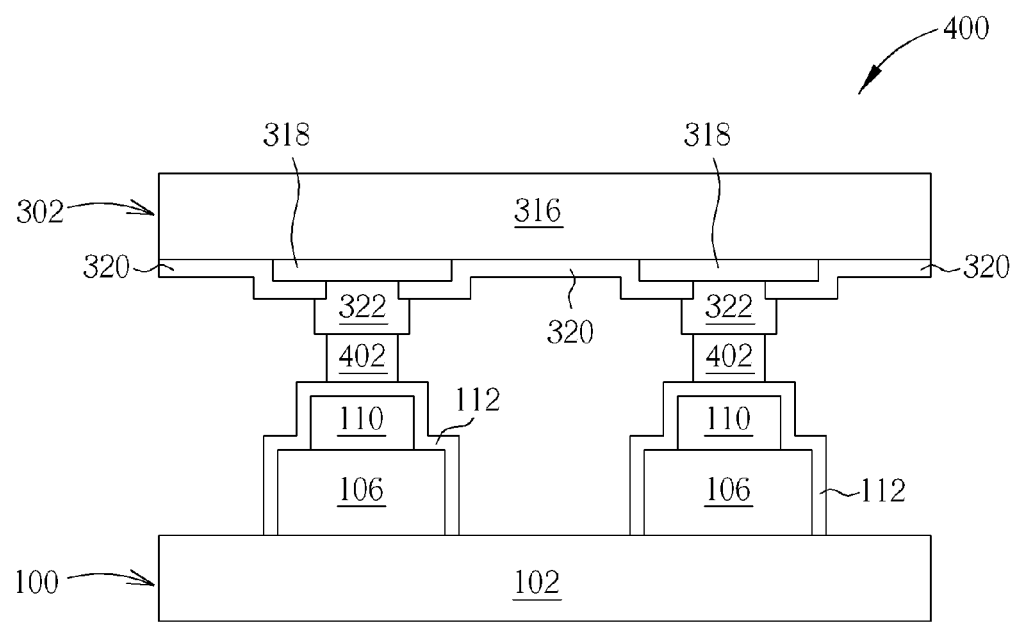
FIG. 14 is a schematic diagram schematic diagram illustrating a cross-sectional view of the package structure according to a sixth preferred embodiment of the present invention.

The present invention is not limited to utilize the eutectic process to bonding the second bump to the solder layer. Please refer to FIG. 14. FIG. 14 is a schematic diagram schematic diagram illustrating a cross-sectional view of the package structure according to a sixth preferred embodiment of the present invention. As shown in FIG. 14, as compared with the fifth embodiment, the package structure 400 further includes an adhesive layer 402, disposed between each first bump 110 and each second bump 322 for bonding the second bump 322 to the first bump 110. Thus, the chip 302 can be bonded to the leads 106 via the adhesive layer 402. The adhesive layer 402 includes non-conductive adhesive paste (NCP), non-conductive adhesive film (NCF), anisotropic conductive paste (ACP) or anisotropic conductive film (ACF), but is not limited to this.

In summary, the present invention disposes the first bump on the lead to reduce the height of the second bump to be smaller than 5 micrometers. For this reason, the material cost of the second bump of the chip can be effectively saved as compared with the height of the gold bump of the chip being between 12 micrometers and 15 micrometers. Therefore, the fabricating cost of bonding the chip 302 onto the circuit board 100 can be effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A circuit board, comprising:
a substrate;
at least one lead, disposed on the substrate;
at least one bump, disposed on the lead; and a solder layer, covering the lead and the bump, and the solder layer being in contact with the lead and extending to a sidewall of the lead.

2. The circuit board according to claim 1, wherein the lead comprises copper.

3. The circuit board according to claim 1, wherein the bump comprises aluminum or copper.

4. The circuit board according to claim 1, wherein the bump has a height, larger than 1 micrometer.

5. The circuit board according to claim 1, wherein the solder layer comprises nickel, palladium, gold or stannum.

6. The circuit board according to claim 1, wherein the substrate is a printed circuit board, a flexible circuit board or a glass substrate.

7. The circuit board according to claim 1, wherein a width of the bump along a first direction is equal to or smaller than a width of the lead along the first direction.

8. A package structure, comprising:
   a substrate;
   at least one lead, disposed on the substrate;
   at least one first bump, disposed on the lead;
   a solder layer, covering the lead and the first bump, and the solder layer being in contact with the lead and extending to a sidewall of the lead; and
   a chip, disposed on the first bump.

9. The package structure according to claim 8, wherein the chip has at least one bonding pad and at least one second bump, and the second bump is disposed between the bonding pad and the first bump.

10. The package structure according to claim 9, wherein the second bump has a second height, smaller than 5 micrometers.

11. The package structure according to claim 9, further comprising an adhesive layer, disposed between the first bump and the second bump for bonding the second bump to the first bump.

12. The package structure according to claim 11, wherein the adhesive layer comprises non-conductive adhesive paste (NCP), non-conductive adhesive film (NCF), anisotropic conductive paste (ACP) or anisotropic conductive film (ACF).

13. The package structure according to claim 9, wherein the bonding pad and the lead have a gap, larger than 1 micrometer.

14. A fabricating method of a circuit board, comprising:
   providing a substrate;
   forming a lead on the substrate;
   forming a bump on the lead; and
   forming a solder layer to cover the lead and the bump, and the solder layer being in contact with the lead and extending to a sidewall of the lead.

15. The fabricating method of the circuit board according to claim 14, wherein the step of forming the lead comprises:
   forming a first patterned photoresist layer on the substrate, and the first patterned photoresist layer having at least one first opening exposing the substrate; and
   forming the lead on the exposed substrate.

16. The fabricating method of the circuit board according to claim 15, wherein the step of forming the bump comprises:
   forming a second patterned photoresist layer on the first patterned photoresist layer, and the second patterned photoresist layer having at least one second opening exposing the lead; and
   forming the bump on the exposed lead.

17. The fabricating method of the circuit board according to claim 16, further comprising removing the first patterned photoresist layer and the second patterned photoresist layer before forming the solder layer.

18. The fabricating method of the circuit board according to claim 15, wherein the step of forming the bump comprises:
   removing the first patterned photoresist layer;
   forming a second patterned photoresist layer on the substrate, and the second patterned photoresist layer having at least one second opening exposing the lead; and
   forming the bump on the exposed lead.

* * * * *